(12) United States Patent
Khachatryan

(10) Patent No.: US 9,566,773 B2
(45) Date of Patent: Feb. 14, 2017

(54) METHOD FOR MANUFACTURING FLEXIBLE DISPLAY APPARATUS AND FLEXIBLE DISPLAY APPARATUS MANUFACTURED BY USING THE METHOD

(71) Applicant: Samsung Display Co., Ltd., Yongin, Gyeonggi-Do (KR)

(72) Inventor: Hayk Khachatryan, Yongin (KR)

(73) Assignee: Samsung Display Co., Ltd. (KR)

( * ) Notice: Subject to any disclaimer, the term of this patent is extended or adjusted under 35 U.S.C. 154(b) by 556 days.

(21) Appl. No.: 14/090,792

(22) Filed: Nov. 26, 2013

(65) Prior Publication Data
US 2014/0377574 A1    Dec. 25, 2014

(30) Foreign Application Priority Data
Jun. 19, 2013  (KR) ................. 10-2013-0070495

(51) Int. Cl.
*B32B 37/12*     (2006.01)
*B32B 43/00*     (2006.01)

(52) U.S. Cl.
CPC ......... *B32B 37/1284* (2013.01); *B32B 43/006* (2013.01); *B32B 2037/1269* (2013.01); *B32B 2379/08* (2013.01); *B32B 2457/20* (2013.01); *H01L 2227/326* (2013.01); *H01L 2251/5338* (2013.01); *Y10T 428/31678* (2015.04)

(58) Field of Classification Search
CPC .............. B32B 37/1284; B32B 43/006; B32B 2457/20; B32B 2307/748
See application file for complete search history.

(56) References Cited

U.S. PATENT DOCUMENTS

| | | | |
|---|---|---|---|
| 5,262,347 A | 11/1993 | Sands | |
| 6,071,795 A | 6/2000 | Cheung et al. | |
| 7,450,295 B2 * | 11/2008 | Tung | B81B 3/001 359/290 |
| 7,842,547 B2 | 11/2010 | Shelton et al. | |
| 2005/0236985 A1 * | 10/2005 | Handa | B32B 17/064 313/511 |
| 2006/0068563 A1 * | 3/2006 | Wong | H01L 21/76254 438/455 |
| 2006/0254704 A1 * | 11/2006 | Seo | B32B 37/12 156/249 |
| 2007/0116948 A1 * | 5/2007 | Kim | B32B 3/085 428/343 |
| 2008/0012012 A1 * | 1/2008 | Hara | H01L 27/283 257/40 |
| 2008/0308231 A1 * | 12/2008 | Lee | B32B 38/10 156/379.8 |
| 2009/0261062 A1 * | 10/2009 | Kim | B32B 7/12 216/24 |
| 2010/0068483 A1 * | 3/2010 | Leu | B32B 7/06 428/212 |
| 2010/0075447 A1 | 3/2010 | Lee et al. | |
| 2010/0200898 A1 * | 8/2010 | Lin | H01L 27/14618 257/294 |
| 2010/0267203 A1 * | 10/2010 | Chen | G02F 1/133305 438/110 |
| 2011/0048516 A1 * | 3/2011 | Bedell | H01L 31/068 136/255 |
| 2011/0104508 A1 * | 5/2011 | Wang | C08F 4/52 428/522 |
| 2011/0279417 A1 * | 11/2011 | Kang | G09G 3/20 345/204 |
| 2012/0114915 A1 * | 5/2012 | Prentice | C23C 4/02 428/201 |
| 2012/0118511 A1 * | 5/2012 | Imai | B32B 38/10 156/712 |
| 2013/0005059 A1 * | 1/2013 | Song | H01L 29/78603 438/28 |
| 2013/0020731 A1 | 1/2013 | Kim et al. | |
| 2013/0071650 A1 * | 3/2013 | Liu | B32B 37/26 428/333 |
| 2013/0168018 A1 * | 7/2013 | Casimiro | C09D 5/20 156/305 |
| 2014/0042649 A1 * | 2/2014 | Ke | H01L 27/1218 264/1.36 |
| 2014/0353589 A1 * | 12/2014 | Cao | H01L 29/66742 257/29 |

OTHER PUBLICATIONS

Jesmin Haq et al.; "Temporary bond—debond technology for high-performance transistors on flexible substrates"; Journal of the SID 18/11, 2010; pp. 884-891.

* cited by examiner

*Primary Examiner* — Liam J Heincer
(74) *Attorney, Agent, or Firm* — Innovation Counsel LLP

(57) ABSTRACT

Provided are a method for manufacturing a flexible display apparatus, which allows for easy separation of a flexible substrate from its supporting carrier as well as allowing easy handling of the flexible substrate during processing of the flexible substrate while it is on its supporting carrier. Also provided is a flexible display apparatus manufactured by the method. The method includes forming an adhesive layer including a metallic tin where the adhesive layer is disposed on a supportive carrier and disposing a flexible substrate on the adhesive layer such that the flexible substrate is affixed to the supporting carrier with the adhesive layer interposed therebetween. The method further includes separating the flexible substrate from the carrier by transformatively stressing (disintegration-wise stressing) the adhesive layer for example by means of temperature lowering.

20 Claims, 4 Drawing Sheets

METHOD FOR MANUFACTURING FLEXIBLE DISPLAY APPARATUS AND FLEXIBLE DISPLAY APPARATUS MANUFACTURED BY USING THE METHOD

CROSS-REFERENCE TO RELATED PATENT APPLICATION

This application claims the benefit of Korean Patent Application No. 10-2013-0070495, filed on Jun. 19, 2013, in the Korean Intellectual Property Office, the disclosure of which application is incorporated herein in its entirety by reference.

BACKGROUND

1. Field of Disclosure

The present disclosure of invention relates to a method for manufacturing a flexible display apparatus. It also relates to a flexible display apparatus manufactured by using the method. The present disclosure more particularly relates to a method for manufacturing a flexible display apparatus supported on a carrier and to facilitating separation of the flexible substrate from the supporting carrier as well as to handling the flexible substrate during the fabrication of the flexible substrate.

2. Description of Related Technology

Recently, in line with increased interest in flexible displays, research into the flexible display apparatuses has been actively undertaken in which the display apparatus is formed on a flexible substrate composed of a flexible material, such as resin.

For example, in a case where a flexible organic light-emitting display (fOLED) apparatus is manufactured, a process of forming a thin film transistor and/or an organic light-emitting device on a flexible substrate is performed.

However, since the substrate used in the flexible display apparatus has flexible characteristics, its handling during manufacturing may be difficult. For example, when a flexible display apparatus is manufactured, a large plurality of pixels, each including one or more thin film transistors and/or organic light-emitting devices, must be accurately formed on the flexible substrate. However, since misalignment in a photolithography process or a mask process may occur due to the flexible characteristics of the flexible substrate, manufacturing defects can easily occur.

SUMMARY

The present disclosure of invention provides a method of mass production manufacturing of a flexible display apparatus which includes supporting a flexible substrate on a more rigid carrier during fabrication and separating the substrate from the carrier thereafter. An intermediate or adhesive layer is provided between the substrate and the carrier where the intermediate adhesive layer is configured to facilitate separation of the flexible substrate from the carrier. More specifically, the intermediate adhesive layer includes transformative material that disintegrates when subject to disintegration stresses. Yet more specifically, the transformative material can be a metallic tin (Beta Sn) which is convertible into a nonmetallic tin (Alpha Sn) when subjected to transformative stresses (disintegration stresses). The transformative stresses can be induced by cooling the adhesive layer to below an α-β transformation temperature of the tin. While the temperature of the adhesive layer is kept above the α-β transformation temperature, the adhesive layer remains intact and the handling of the flexible substrate in a process of processing the flexible substrate is simplified.

According to an aspect of the present disclosure, there is provided a method for manufacturing a flexible display apparatus, the method including: forming an adhesive layer, including tin, on a carrier; disposing a flexible substrate on the adhesive layer; and separating the flexible substrate from the carrier by transformatively stressing (disintegration-wise stressing) the adhesive layer.

The forming of the adhesive layer may include forming a tin doped ceramic layer on the carrier.

The forming of the adhesive layer may include forming a layer including at least any one of a silica, a zirconia, and an alumina on the carrier, wherein the layer is formed as a tin doped layer. Tin concentration may be maximized at a mid-portion of a predetermined thickness of the adhesive layer and may decrease with distance away from the mid-portion.

The method may further include forming a first sacrificial layer on the carrier; and forming a second sacrificial layer on the adhesive layer, wherein the forming of the adhesive layer may include forming an adhesive layer including tin, on the first sacrificial layer, and the disposing of the flexible substrate may include disposing a flexible substrate on the second sacrificial layer.

In this case, the forming of the first sacrificial layer and the forming of the second sacrificial layer may respectively include using a ceramic material. Specifically, the forming of the first sacrificial layer may include using at least any one of a vermiculite, a pearlite, a wermlandite, and a hydrotalcite. The forming of the second sacrificial layer may include using at least any one of a silica, an alumina, a silicon nitride, an aluminum oxynitride, and a silicon oxynitride.

The forming of the adhesive layer may include forming an adhesive layer including metallic tin on the carrier, wherein a concentration of tin near a surface of the adhesive layer is lower than a concentration of tin at a center portion of the adhesive layer. In this case, the forming of the adhesive layer may include forming the adhesive layer including tin on the carrier, wherein the concentration of tin is gradually increased and decreased as moving away from the carrier. The forming of the adhesive layer may include forming an adhesive layer in which at least any one of a silica, a zirconia, and an alumina is mixed with tin.

The disposing of the flexible substrate may include applying a material for a flexible substrate to the adhesive layer. Specifically, the disposing of the flexible substrate may include applying a transparent polyimide to the adhesive layer. In this case, the disposing of the flexible substrate may include forming a transparent flexible substrate by applying the transparent polyimide to the adhesive layer.

The method may further include forming an amorphous silicon layer on the flexible substrate disposed on the adhesive layer and crystallizing the amorphous silicon layer.

The separating of the flexible substrate from the carrier may include separating the flexible substrate from the carrier by transformatively stressing (disintegration-wise stressing) the adhesive layer by decreasing a temperature of the adhesive layer. Specifically, the separating of the flexible substrate from the carrier may include separating the flexible substrate from the carrier by transformatively stressing (disintegration-wise stressing) the adhesive layer as the metallic tin in the adhesive layer is transformed from a metallic beta state into a nonmetallic alpha state by decreasing the temperature of the adhesive layer. In this case, operations other than the separating of the flexible substrate from the carrier may be performed in a state in which tin included in the adhesive layer is in the beta state.

The carrier may include a glassy ceramic.

The method may further include forming a display device on the flexible substrate.

According to another aspect of the present disclosure, there is provided a flexible display apparatus manufactured by using the above-described method for manufacturing flexible display apparatus. In this case, the flexible display apparatus may include a tin component on a first surface of the flexible substrate, the first surface being opposite to a second surface of the flexible substrate, the second surface being closer to the opto-electronic features of the display device than the first surface.

BRIEF DESCRIPTION OF THE DRAWINGS

The above and other features and advantages of the present disclosure of invention will become more apparent by describing in detail exemplary embodiments thereof with reference to the attached drawings in which.

DETAILED DESCRIPTION

Figure 1:
FIGS. 1 and 2 are cross-sectional views schematically illustrating processes of a method for manufacturing a flexible display apparatus, according to an embodiment of the present disclosure of invention.

The present disclosure of invention will now be described more fully with reference to the accompanying drawings, in which exemplary embodiments are shown. Embodiments in accordance with the present disclosure may, however, be embodied in many different forms and should not be construed as being limited to the embodiments set forth herein; rather, these embodiments are provided so that this disclosure will be thorough and complete, and will fully convey the concepts of the present teachings to those skilled in the art. Also, it should be noted that elements shown in the accompanying drawings may be scaled up or down for convenience in description. For example, since the size and thickness of each element in the drawings is arbitrarily illustrated for convenience in description, the present teachings are not necessarily limited to those as illustrated.

In the following embodiments, x-, y-, and z-axes are not limited to three axes in a Cartesian coordinate system, but may be interpreted in a broad sense including the three axes. For example, x-, y-, and z-axes may be orthogonal to one another, but may denote different directions that are not orthogonal to one another.

It will be understood that when an element such as a layer, film, region, or substrate is referred to as being "on" another element, it can be directly on the other element or intervening elements may also be present.

As used herein, the term "and/or" includes any and all combinations of one or more of the associated listed items. Expressions such as "at least one of," when preceding a list of elements, modify the entire list of elements and do not modify the individual elements of the list.

Figure 2:
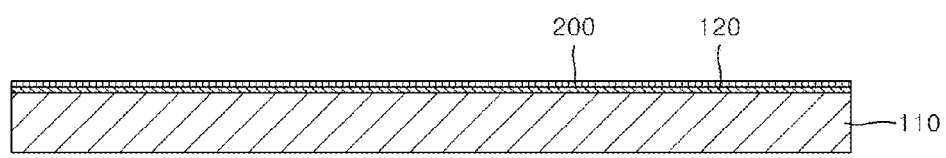

FIGS. 1 and 2 are cross-sectional views schematically illustrating processes of a method for manufacturing a flexible display apparatus, according to a first embodiment of the present disclosure of invention.

First, as illustrated in FIG. 1 and in accordance with the present disclosure, an adhesive layer 120 that includes tin, is formed on a supporting carrier 110. Since the supporting carrier 110 is sufficiently thicker than the to-be-attached flexible substrate 200, the latter can be stably disposed on the carrier 110. In one class of embodiments, the carrier 110 is rigid and has a low coefficient of thermal expansion. In other words, it may not be bent or deformed during processing of the flexible substrate 200 that is to be stably disposed on the carrier. The carrier 110 may include a glassy ceramic or the carrier 110 may be formed of a glass. However, in these cases, the carrier 10 may break due defects (e.g., strains) evolving from repeated use and/or cracks may occur therein. However, since glassy ceramics tend to have excellent heat resistance and strength, it is desirable to use these materials. The deformation thereof and damage thereto may be minimized despite repeated use by appropriate choice of the substrate-holding adhesive 120.

When the adhesive layer 120 is formed on the carrier 110, in one embodiment, the adhesive layer 120, may be a layer consisting only of white metallic tin (Beta Sn). The formation of the adhesive layer 120 on the carrier 110, for example, may be performed by deposition, such as chemical vapor deposition (CVD), or sputtering of tin on the carrier 110.

When the adhesive layer 120 is so deposited, a tin-plated ceramic layer may be formed as a top surface of the carrier 110. In this case, a layer including at least any one of a silica, a zirconia, and an alumina may be formed within the tin-plating that is formed on the carrier 110. Alternatively, the plated-on layer may also be formed as a tin-plated layer. When the adhesive layer 120 is so formed in the metallic Beta Sn state, the separation of the carrier 110 and the flexible substrate 200 using transformative characteristics of tin as described below may be facilitated and simultaneously, an amount of tin used in the adhesive layer 120 may be reduced. Thus, manufacturing costs may be reduced.

Next, as illustrated in FIG. 2, the flexible substrate 200 is disposed on the tin-containing adhesive layer 120. This operation may include an applying of a material of the flexible substrate to a top surface of the carrier 110 and a curing of that applied material. Examples of the applied material of the flexible substrate may include one or more of a polyimide, a polyethylene a naphthalate, a polyethylene terephthalate, a polyetheretherketone, a polyethersulfone, a polymethylmethacrylate, a polycarbonate and a polypropylene. In particular, in a case where a polyimide is used, the flexible substrate 200 may be formed as a transparent polyimide substrate.

The flexible substrate 200 is disposed on the carrier 110, and an operation of processing the flexible substrate 200 is then performed. For example, an operation of forming an amorphous silicon layer on the flexible substrate 200 and crystallizing the amorphous silicon layer may be performed. An excimer laser may be used in the operation of crystallizing the amorphous silicon layer. In this case, in order for an entire surface or a predetermined portion of the amorphous silicon layer to be irradiated with an excimer laser beam, a top surface of the amorphous silicon layer may be scanned with an excimer laser beam.

In addition, other operations of processing the flexible substrate 200 may be performed. For example, an operation of forming mutually facing pixel and common electrodes, and an intermediate layer disposed therebetween and including a light-emitting layer may be performed. Also, during this operation, various processes, such as a photolithography process or a mask process, may be performed if necessary. In this case, since the flexible substrate 200 is combined with the carrier 110 through the tin-including adhesive layer 120, the occurrence of misalignment in the photolithography process or the mask process due to the flexible characteristics of the flexible substrate 200 may be effectively prevented.

Thereafter, the flexible substrate 200 is separated from the carrier 110 by applying transformative stresses (disintegration stresses) to the tin-including adhesive layer 120. That is, when the adhesive layer 120 is transformatively stressed (disintegration-wise stressed), the tin switches from the Beta metallic (more dense) state to its crystalline alpha (less dense) state where it is non-adhesive in the alpha state. Therefore, the flexible substrate 200 which is fixed to the carrier 110 by way of the Beta-state tin in the adhesive layer 120 is allowed to naturally separate from the carrier 110 when the tin disintegrates into its brittle and easily fractured alpha state (gray state). Therefore, the flexible substrate 200 subjected to necessary processing or a structure including the flexible substrate 200 may be secured during processing and then non-destructively separated from the carrier after the processing.

Figure 3:
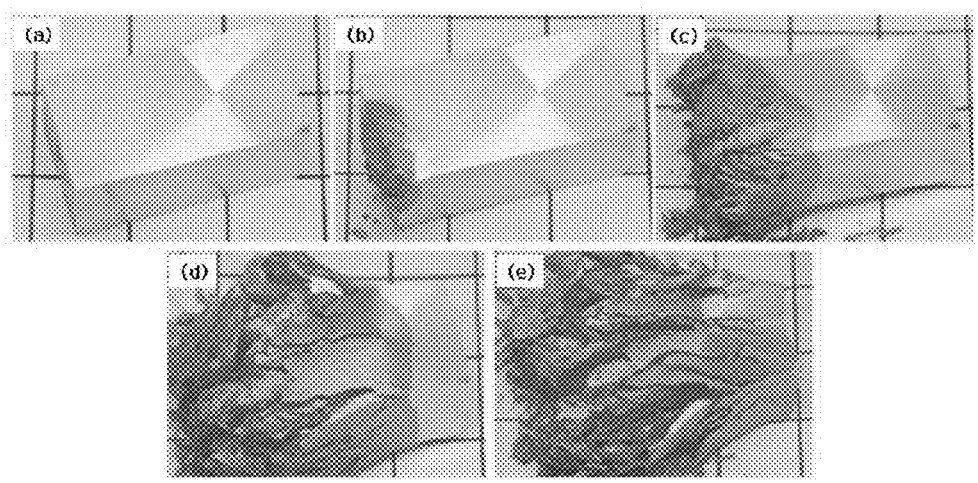
FIG. 3 provides photographs illustrating changes in the state of tin when included in an adhesive layer illustrated in FIGS. 1 and 2.

FIG. 3 illustrates photographs illustrating changes in the state of tin included in the adhesive layer 120 illustrated in FIGS. 1 and 2. Tin in the state as illustrated in FIG. 3(a) is metallic (Beta state) and adhesive. But when the Beta state tin is subjected to transformative forces, it breaks apart (disintegrates) and finally becomes a powder or enters a state similar thereto through the states illustrated in FIGS. 3(b) to 3(e). That is, the adhesive layer 120 that is deposited with tin in the metallic Beta-state (white tin) may be transformatively stressed (disintegration-wise stressed) so as to switch into the powder or similar Alpha state (gray tin) for example by changing the temperature of the tin to below its α-β transformation temperature, and as a result, the flexible substrate 200 may be separated from the carrier 110 without damage to the flexible substrate 200 or a structure formed on the flexible substrate 200.

Specifically, tin in the state as illustrated in FIG. 3(a) finally becomes powder or a state similar thereto through the states illustrated in FIGS. 3(b) to 3(e) as the temperature decreases. That is, the adhesive layer 120 may be transformatively stressed (disintegration-wise stressed) into powder or a state similar thereto by decreasing the temperature to below room temperature and more specifically, to below the α-β transformation temperature of the deposited tin composition, and as a result, the flexible substrate 200 may be separated from the carrier 110 without damage to the flexible substrate 200 or the structure formed on the flexible substrate 200.

Tin may exist in the state having metallic characteristics, as illustrated in FIG. 3(a), at a temperature of about 13° C. or more. The above-described state of tin may be denoted as a beta state (or white tin state). Tin in the beta state has an excellent bonding force with the carrier 110 including glass ceramic as well as an excellent bonding force with the flexible substrate 200 including polyimide. Therefore, the flexible substrate 200 may be stably fixed to the carrier 110.

The α-β transformation temperature may vary with addition of certain impurities (e.g. Al, Zn; which lower the α-β transformation temperature) to tin. Other impurities (e.g., Sb or Bi) which tend to increase the α-β transformation temperature are to be generally avoided.

In particular, tin maintains the beta state at a temperature of about 13° C. or more, and since the temperature at which a process of crystallizing an amorphous silicon layer or a process of deposition or patterning other layers is performed is relatively higher than about 13° C., the flexible substrate 200 may be stably fixed to the carrier 110 without changes in the Beta state of tin during the processes of processing a substrate. In addition, since tin in the beta state has a low thermal expansion coefficient, the occurrence of delamination or detachment of the flexible substrate 200 from the carrier 110 due to thermal expansion during the processes of processing a substrate may be effectively prevented.

When the temperature of the tin is decreased to about 13° C. or less, phase transformation of tin occurs from the metallic beta state into a brittle alpha state. Tin in the alpha state has non-metallic characteristics and particularly, the volume of tin begins to expand (its density decreases) as the phase transformation from the beta state into the alpha state occurs. The reason for this is that tin in the beta state has a tetragonal crystal structure, while tin in the alpha state has a cubic crystal structure, in which a volume change rate due to the change in crystal structure during the phase transformation reaches about 27%. Thus, as the tin microstructures expand within its body due to α-β transformation, the body fractures or disintegrates and attains a powdery constitution.

The adhesive layer 120 is transformatively stressed (disintegration-wise stressed) into powder or a state similar thereto due to the volume change as the phase transformation from the beta state into the alpha state progresses, and as a result, the flexible substrate 200 may be allowed to be separated from the carrier 110 without excessively stressing either the flexible substrate 200 or the carrier 110. Operations other than the operation of separating the flexible substrate 200 from the carrier 110 are allowed to be performed in a state in which tin included in the adhesive layer 120 is in the beta state.

The flexible substrate 200 is separated from the carrier 110 through the phase transformation of the adhesive layer 120, and a portion of the adhesive layer 120 may then remain on the flexible substrate 200. In this case, components of the adhesive layer 120 remaining on the flexible substrate 200 may be removed by air blowing and/or mechanical polishing or other such surface cleaning techniques.

Figure 4:
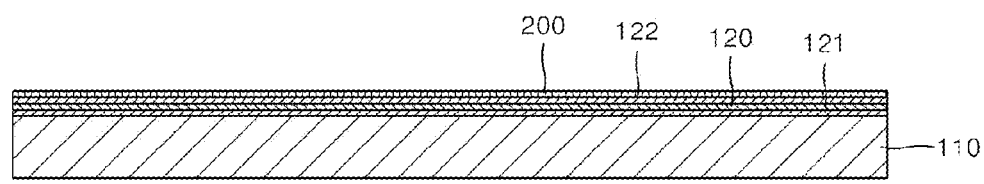
FIGS. 4 and 5 are cross-sectional views schematically illustrating processes for manufacturing a flexible display apparatus, according to another embodiment of the present disclosure.
Figure 5:
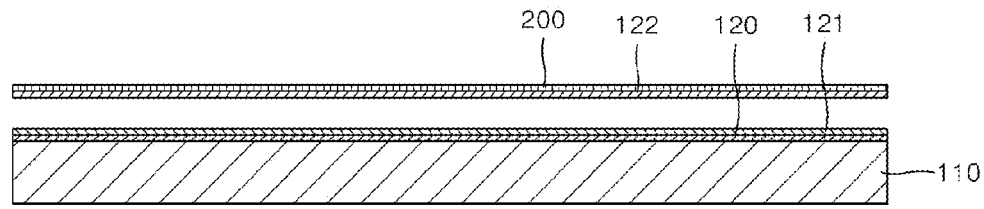

FIGS. 4 and 5 are cross-sectional views schematically illustrating processes of a method for manufacturing a flexible display apparatus, according to another embodiment of the present disclosure. In the method for manufacturing a flexible display apparatus, according to the present embodiment, as illustrated in FIG. 4, a first sacrificial layer 121 is formed on a carrier 110, an adhesive layer 120 including beta-phase tin, is formed on the first sacrificial layer 121, and a second sacrificial layer 122 is formed on the adhesive layer 120. A flexible substrate 200 is disposed above the adhesive layer 120, wherein the flexible substrate 200 is allowed to be disposed on and engaged with the second sacrificial layer 122. Thereafter, various substrate processing steps such as may be necessary process for forming thin film transistors or display device optic features on the flexible substrate 200 are performed. The flexible substrate 200 is thereafter separated from the carrier 110, as illustrated in FIG. 5, by transformatively stressing (disintegration-wise stressing) the adhesive layer 120.

In the method for manufacturing a flexible display apparatus, according to the present embodiment (FIGS. 4-5), the adhesive layer 120 is not directly in contact with the flexible substrate 200, but rather the second sacrificial layer 122 is disposed therebetween. Therefore, materials (e.g., impurities) present in the adhesive layer 120 do not penetrate into the flexible substrate 200 or affect electronic components, such as the thin film transistors. The flexible substrate 200 may thus be effectively prevented from being contaminated due to presence of the second sacrificial layer 122. The second sacrificial layer 122 may be formed of a ceramic material, in which at least any one of silica, alumina, silicon nitride, aluminum oxynitride, and silicon oxynitride may be specifically used.

In particular, in a case where an organic light-emitting device (OLED) is formed on the flexible substrate 200, the organic light-emitting device may be easily damaged by impurities, such as outside moisture or oxygen. In this case, the second sacrificial layer 122 remains on the flexible substrate 200, and thus, the second sacrificial layer 122 may function as a barrier to prevent the penetration of impurities from the adhesive layer 120 during manufacturing, and the second sacrificial layer 122 may also function to effectively prevent the penetration of outside impurities into a flexible display apparatus, i.e., a final product, by being disposed on an outer surface of the flexible display apparatus after the manufacturing. In some cases, the flexible substrate 200 is separated from the carrier 110, and a selective operation (e.g., CMP) of removing the second sacrificial layer 122 may then be performed.

The first sacrificial layer 121 may be formed of a ceramic material, in which at least any one of vermiculite, pearlite, wermlandite, and hydrotalcite may be specifically used. The first sacrificial layer 121 may function to protect the carrier 110 from the adhesive layer 120.

That is, as described above, the adhesive layer 120 becomes powder or a state similar thereto by being transformatively stressed (disintegration-wise stressed) due to the microstructural volume changes generated according to the change in temperature. In a case where the occurrence of the volume change of the adhesive layer 120 is repeated in a state in which the adhesive layer 120 is directly in contact with the carrier 110 during the repeated use of the carrier 110, the lifetime of the carrier 110 may be adversely affected, for example, cracks may occur in a surface of the carrier 110.

However, according to the method for manufacturing a flexible display apparatus, according to the present embodiment, since the first sacrificial layer 121 is disposed between the adhesive layer 120 and the carrier 110, the first sacrificial layer 121 may effectively protect the carrier 110 from the transformative stresses (disintegration stresses) generated in the adhesive layer 120 during separation.

As illustrated in FIG. 5, the first sacrificial layer 121 may remain on the carrier 110 even in the case where the flexible substrate 200 is separated from the carrier 110, wherein the remaining first sacrificial layer 121 may not be removed and may be reused during subsequent processing of another flexible substrate 200. That is, an adhesive layer 120 including tin, a second sacrificial layer 122, and a flexible substrate 200 are again sequentially disposed on the remaining first sacrificial layer 121, and a process of processing the flexible substrate 200 may be then performed. However, if necessary, the first sacrificial layer 121 may be selectively removed after the flexible substrate 200 is separated from the carrier 110, or a process of reinforcing a damaged portion of the first sacrificial layer 121 may be performed.

Figure 6:
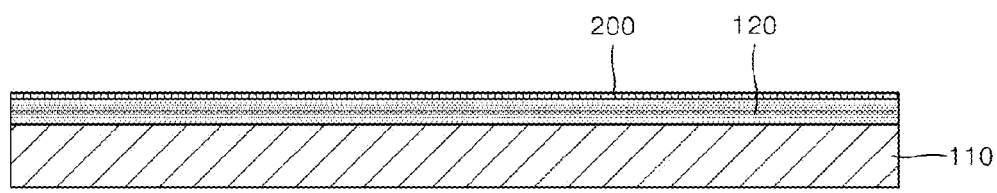
FIG. 6 is a cross-sectional view schematically illustrating a process for manufacturing a flexible display apparatus, according to another embodiment of the present disclosure.

FIG. 6 is a cross-sectional view schematically illustrating a process of a method for manufacturing a flexible display apparatus, according to another embodiment of the present disclosure. According to the method for manufacturing a flexible display apparatus according to the present embodiment, although tin is included in an adhesive layer 120 during the formation of the adhesive layer 120 on a carrier 110, the adhesive layer 120 may be formed to have a concentration gradient in which a concentration of tin is gradually increased to a peak level and then decreased when moving away from the carrier 110 and towards the flexible substrate 200. That is, the concentration of tin near a surface of the adhesive layer 120 in a direction toward the carrier 110 or in a direction opposite thereto may be low and the concentration of tin at a center portion of the adhesive layer 120 may be relatively high (e.g., at a predetermined peak level). This depth variable concentration of tin may be attained by use of variable feedstock during CVD, PVD or alike deposition techniques used to form the Beta-state tin.

A flexible substrate 200 may be easily separated from the carrier 110 by the phase transformation of tin that is at the higher concentration portion at the center portion of the adhesive layer 120. Simultaneously, the effect of the tin on the carrier 110 and/or the flexible substrate 200 or damage to the surface thereof due to tin itself or the phase transformation of tin may be effectively prevented or reduced by decreasing the concentration of tin as a function of depth within the adhesive layer 120 so that tin concentration is minimized near the carrier 110 and/or near the flexible substrate 200.

When the adhesive layer 120 having the above concentration gradient is formed, the adhesive layer 120 may be formed in which at least any one of silica, zirconia, and alumina is mixed with tin.

However, when the concentration gradient of tin exists in the adhesive layer 120, the concentration gradient does not always have to linearly decrease or increase. For example, when the adhesive layer 120 is formed on the carrier 110, it may be sufficient that the adhesive layer 120 is formed in such a manner that the concentration of tin near the surface of the adhesive layer 120 in the direction toward the carrier 110 or in the direction opposite thereto is lower than the concentration of tin at the center portion of the adhesive layer 120.

According to another embodiment of the present disclosure, an adhesive layer including a tin is formed on the supporting carrier. Next, a flexible substrate is formed on the adhesive layer. And then, if necessary, other steps processing the flexible substrate may be performed. For example, an amorphous silicon layer may be formed on the flexible substrate and the amorphous silicon layer may be crystallized by laser annealing or heating. After processing the flexible substrate, the flexible substrate is separated from the carrier by crushing the adhesive layer. Crushing the adhesive layer may be performed by decreasing temperature as described above, or by other appropriate methods using the characteristics of the tin.

While the fixation of the flexible substrate 200 on the carrier 110 by using the adhesive layer 120 and the separation of the flexible substrate 200 from the carrier 110 have been mainly described, the present disclosure of invention is not limited thereto. For example, an operation of forming a display device, such as an organic light-emitting device (OLED) on the flexible substrate 200 may be performed before the flexible substrate 200 is separated from the carrier 110. A flexible display apparatus including the organic light-emitting display apparatus thus manufactured may also be included in the scope of the present disclosure of invention.

Figure 7:
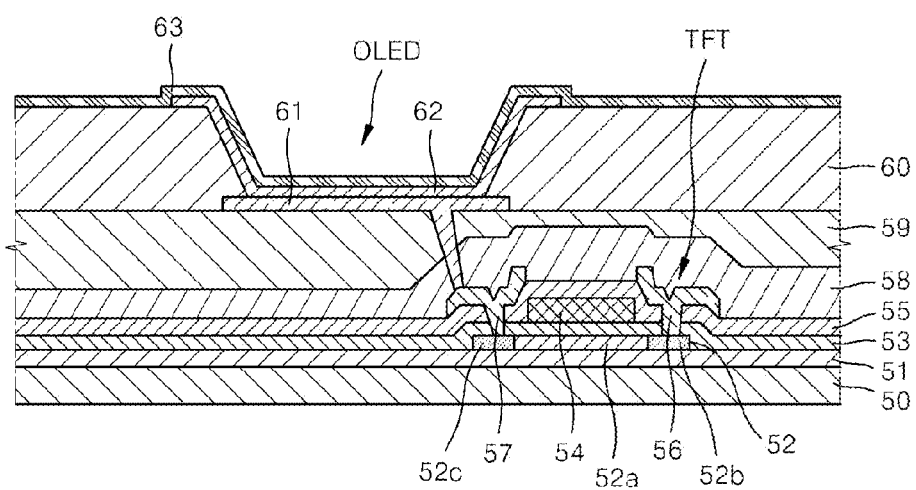
FIG. 7 is a cross-sectional view schematically illustrating a flexible display apparatus, according to another embodiment of the present disclosure.

In a case where an organic light-emitting device is formed on the flexible substrate 200, a flexible organic light-emitting display apparatus as illustrated in FIG. 7 may be realized.

Referring to FIG. 7, with respect to the flexible organic light-emitting display apparatus according to the present embodiment, various components are formed on a flexible substrate 50. Herein, the flexible substrate 50 may be the flexible substrate 200 described in the foregoing embodiments with reference to FIGS. 1 to 6 or may be a cross sectional cut portion of the substrate 200.

A common layer, such as a buffer layer 51, a gate dielectric layer 53, or an interlayer dielectric 55, may be formed on an entire surface of the substrate 50. A patterned semiconductive layer 52 including a channel region 52*a*, a source contact region 52*b*, and a drain contact region 52*c* may be formed, and a gate electrode 54, a source electrode 56, and a drain electrode 57 constituting a thin film transistor (TFT) may be formed, in addition to the patterned semiconductive layer 52.

Also, a protective layer 58 covering the TFT, and a planarization layer 59 disposed on the protective layer 58 and having an approximately flat top surface may be formed on the entire surface of the substrate 50. An organic light-emitting device (OLED), including a patterned pixel electrode 61, a counter electrode 63 roughly corresponding to the entire surface of the substrate 50, and a multilayer-structured intermediate layer 62 that is disposed between the pixel electrode 61 and the counter electrode 63 and includes a light-emitting layer, may be formed on the planarization layer 59.

Different from the intermediate layer 62 illustrated in FIG. 7, some layers of the intermediate layer 62 may be common layers roughly corresponding to the entire surface of the substrate 50, and some other layers thereof may be patterned layers that are patterned to correspond to the pixel electrode 61. The pixel electrode 61 may be electrically connected to the TFT through a via hole. A pixel-defining layer 60 covering edges of the pixel electrode 61 and having openings defining each pixel area may be formed on the planarization layer 59 so as to roughly correspond to the entire surface of the substrate 50.

The above-described flexible organic light-emitting display apparatus may be manufactured by using the method for manufacturing a flexible display apparatus, according to the foregoing embodiments.

With respect to a flexible display panel thus manufactured, a tin component may be included on a surface of the flexible substrate 50 opposite to a surface of the flexible substrate 50 in a direction in which a display device (e.g., the OLED) is formed. The reason for this is that the substrate 50 is processed after the flexible substrate 50 is fixed to the carrier 110 by using the adhesive layer 120 including tin. Herein, that the tin component is included on the surface the flexible substrate 50 opposite to the surface the flexible substrate 50 in the direction in which the display device (e.g., the OLED) is formed and this may be interpreted as meaning that the case where a protective layer is formed on the surface of the flexible substrate 50 opposite to the surface of the flexible substrate 50 in the direction, in which the display device (e.g., the OLED) is formed, and the tin component is included on the protective layer. In the latter case, the protective layer may be regarded as a part of the flexible substrate 50 in the final product itself.

According to an embodiment of the present disclosure, a method for manufacturing a flexible display apparatus, which may facilitate the separation of a flexible substrate as well as the handling of the flexible substrate in a process of processing the flexible substrate, and a flexible display apparatus manufactured by using the method may be realized. However, the scope of the present disclosure of invention is not limited to these effects.

While the present disclosure of invention has been particularly shown and described with reference to exemplary embodiments thereof, it will be understood by those of ordinary skill in the art in light of the foregoing that various changes in form and details may be made therein without departing from the spirit and scope of the present teachings.

What is claimed is:

1. A method for manufacturing a flexible display apparatus, the method comprising:
    forming an adhesive layer, including tin, on a supporting carrier;
    disposing a flexible substrate on the adhesive layer; and
    separating the flexible substrate from the carrier by crushing the adhesive layer by decreasing a temperature of the adhesive layer.

2. The method of claim 1, wherein the forming of the adhesive layer comprises forming a tin doped ceramic layer on the carrier.

3. The method of claim 1, further comprising:
    forming a first sacrificial layer on the carrier; and
    forming a second sacrificial layer on the adhesive layer,
    wherein the forming of the adhesive layer comprises forming an adhesive layer, including the tin, on the first sacrificial layer, and the disposing of the flexible substrate comprises disposing a flexible substrate on the second sacrificial layer.

4. The method of claim 1, wherein the disposing of the flexible substrate comprises applying a material for a flexible substrate to the adhesive layer.

5. The method of claim 1, wherein the disposing of the flexible substrate comprises applying a polyimide to the adhesive layer.

6. The method of claim 5, wherein the disposing of the flexible substrate comprises forming a transparent flexible substrate by applying a polyimide to the adhesive layer.

7. The method of claim 1, further comprising forming an amorphous silicon layer on the flexible substrate disposed on the adhesive layer and crystallizing the amorphous silicon layer before said separating of the flexible substrate from the carrier.

8. The method of claim 1, wherein the separating of the flexible substrate from the carrier comprises separating the flexible substrate from the carrier by transformatively stressing (disintegration-wise stressing) the adhesive layer.

9. The method of claim 1, wherein the carrier comprises a glassy ceramic.

10. The method of claim 1, further comprising forming a display device on the flexible substrate.

11. A flexible display apparatus manufactured according to claim 10.

12. The flexible display apparatus of claim 11, wherein a tin component is included on a first surface of the flexible substrate, the first surface being opposite to a second surface of the flexible substrate, the second surface being closer to the display device than the first surface.

13. A method for manufacturing a flexible display apparatus, the method comprising:
    forming an adhesive layer, including tin, on a supporting carrier;

disposing a flexible substrate on the adhesive layer; and
separating the flexible substrate from the carrier by crushing the adhesive layer, wherein the forming of the adhesive layer comprises:
forming a layer including at least any one of silica, zirconia, and alumina on the carrier,
wherein the layer is formed as a tin doped layer.

14. A method for manufacturing a flexible display apparatus, the method comprising:
forming an adhesive layer, including tin, on a supporting carrier;
disposing a flexible substrate on the adhesive layer;
separating the flexible substrate from the carrier by crushing the adhesive layer;
forming a first sacrificial layer on the carrier; and
forming a second sacrificial layer on the adhesive layer,
wherein the forming of the adhesive layer comprises forming an adhesive layer, including the tin, on the first sacrificial layer, and the disposing of the flexible substrate comprises disposing a flexible substrate on the second sacrificial layer, wherein the first sacrificial layer and the second sacrificial layer respectively are formed from a ceramic material.

15. A method for manufacturing a flexible display apparatus, the method comprising:
forming an adhesive layer, including tin, on a supporting carrier;
disposing a flexible substrate on the adhesive layer;
separating the flexible substrate from the carrier by crushing the adhesive layer;
forming a first sacrificial layer on the carrier; and
forming a second sacrificial layer on the adhesive layer,
wherein the forming of the adhesive layer comprises forming an adhesive layer, including the tin, on the first sacrificial layer, and the disposing of the flexible substrate comprises disposing a flexible substrate on the second sacrificial layer, wherein the first sacrificial layer is formed from at least any one of vermiculite, pearlite, wermlandite, and hydrotalcite.

16. A method for manufacturing a flexible display apparatus, the method comprising:
forming an adhesive layer, including tin, on a supporting carrier;
disposing a flexible substrate on the adhesive layer;
separating the flexible substrate from the carrier by crushing the adhesive layer;
forming a first sacrificial layer on the carrier; and
forming a second sacrificial layer on the adhesive layer,
wherein the forming of the adhesive layer comprises forming an adhesive layer, including the tin, on the first sacrificial layer, and the disposing of the flexible substrate comprises disposing a flexible substrate on the second sacrificial layer, wherein the second sacrificial layer is formed from at least any one of silica, alumina, silicon nitride, aluminum oxynitride, and silicon oxynitride.

17. A method for manufacturing a flexible display apparatus, the method comprising:
forming an adhesive layer, including tin, on a supporting carrier;
disposing a flexible substrate on the adhesive layer; and
separating the flexible substrate from the carrier by crushing the adhesive layer, wherein the forming of the adhesive layer comprises forming the adhesive layer including the tin to a predetermined thickness on the carrier,
wherein a concentration of tin near a surface of the adhesive layer is lower than a concentration of tin at a mid-thickness portion of the adhesive layer.

18. The method of claim 17, wherein the forming of the adhesive layer comprises forming an adhesive layer in which at least any one of silica, zirconia, and alumina is mixed with the tin.

19. A method for manufacturing a flexible display apparatus, the method comprising:
forming an adhesive layer, including tin, on a supporting carrier;
disposing a flexible substrate on the adhesive layer; and
separating the flexible substrate from the carrier by crushing the adhesive layer, wherein the separating of the flexible substrate from the carrier comprises separating the flexible substrate from the carrier by transformatively stressing (disintegration-wise stressing) the adhesive layer so that the tin in the adhesive layer is piece-wise transformed from a beta state into an alpha state due to the decreasing of the temperature of the adhesive layer.

20. The method of claim 19, wherein operations other than the separating of the flexible substrate from the carrier are performed in a state in which tin included in the adhesive layer remains predominantly in the beta state.

* * * * *